(12) United States Patent
Cheng

(10) Patent No.: US 8,896,012 B2
(45) Date of Patent: Nov. 25, 2014

(54) LIGHT EMITTING DIODE

(75) Inventor: Chih-Ching Cheng, Taichung (TW)

(73) Assignee: Huga Optotech, Inc., Taichung County (TW)

( * ) Notice: Subject to any disclaimer, the term of this patent is extended or adjusted under 35 U.S.C. 154(b) by 527 days.

(21) Appl. No.: 12/943,918

(22) Filed: Nov. 10, 2010

(65) Prior Publication Data

US 2012/0049234 A1  Mar. 1, 2012

(30) Foreign Application Priority Data

Aug. 26, 2010 (TW) .............................. 99128619 A

(51) Int. Cl.
*H01L 29/72*  (2006.01)
*H01L 33/38*  (2010.01)
*H01L 33/20*  (2010.01)
*H01L 33/08*  (2010.01)
*H01L 33/44*  (2010.01)

(52) U.S. Cl.
CPC ......... *H01L 33/38* (2013.01); *H01L 2933/0016* (2013.01); *H01L 33/20* (2013.01); *H01L 33/08* (2013.01); *H01L 33/44* (2013.01)
USPC ............... 257/99; 257/E33.064; 257/E33.072

(58) Field of Classification Search
CPC .................................................. H01L 33/486
USPC ............................. 257/99, E33.064, E33.072
See application file for complete search history.

(56) References Cited

U.S. PATENT DOCUMENTS 6,097,040 A * 8/2000 Morimoto et al. .............. 257/91
2006/0138436 A1* 6/2006 Chen et al. ..................... 257/98

FOREIGN PATENT DOCUMENTS

TW           200943579         10/2009

* cited by examiner

*Primary Examiner* — Edward Wojciechowicz
(74) *Attorney, Agent, or Firm* — Patterson + Sheridan, LLP

(57) ABSTRACT

A light-emitting diode includes a substrate, a first semiconductor layer above the substrate, an active layer above the first semiconductor layer, a second semiconductor layer above the active layer, wherein the active layer is between the first semiconductor layer and the second semiconductor layer a trench penetrating through the second semiconductor layer and the active layer to expose the first semiconductor layer a first electrode disposed at a bottom of the trench, wherein the first electrode includes at least one first finger, an insulating layer covering the first electrode, and a second electrode including at least one second finger on the insulating layer, wherein the second finger overlaps with the first finger and the second finger has a width smaller than that of the trench.

19 Claims, 8 Drawing Sheets

LIGHT EMITTING DIODE

BACKGROUND OF THE INVENTION

1. Field of the Invention

The present invention relates generally to the field of light-emitting diode (LED) technology. More particularly, the present invention relates to a high-brightness LED structure with overlapping first and second electrodes.

2. Description of the Prior Art

A light-emitting diode (LED) is a solid-state semiconductor light source, which is fabricated by semiconductor materials. LEDs are used in applications as diverse as replacements for aviation lighting, automotive lighting (particularly indicators) and in traffic signals. The compact size of LEDs has allowed new text and video displays and sensors to be developed, while their high switching rates are useful in advanced communications technology.

FIG. 1 is a plan view of a conventional light-emitting diode with comb-shaped electrodes. FIG. 2 is a cross-sectional view taken along line I-I' of FIG. 1. As shown in FIG. 1 and FIG. 2, the conventional light-emitting diode 10 comprises a second electrode 30 disposed on the second semiconductor layer 20 and a first electrode 40 disposed on the first semiconductor layer 50. The second electrode 30 does not overlap with the first electrode 40. The first electrode 40 is formed in a comb-shaped trench 60 that is formed by etching through the second semiconductor layer 20 and the active layer 22. The trench 60 exposes a portion of the first semiconductor layer 50 and the first electrode 40 is disposed at the bottom of the trench 60.

As shown in FIG. 2, the second electrode 30 comprises a connecting portion 30a and a plurality of finger electrodes 30b orthogonally extending from the connecting portion 30a. The first electrode 40 comprises a connecting portion 40a and a plurality of finger electrodes 40b orthogonally extending from the connecting portion 40a. The connecting portion 30a is parallel with the connecting portion 40a. The finger electrodes 30b and the finger electrodes 40b are interdigitated in the area between the connecting portion 30a and the connecting portion 40a. In order to improve the current spreading characteristic of the LED device, the distance between the finger electrode 30b and the finger electrode 40b is remained fixed.

However, the above-described light-emitting diode has several drawbacks and shortcomings. For example, when the light-emitting diode 10 is in operation, the LED device is prone to local fracture or burn down due to point discharge that stems from the accumulation of the electric current at the tips of the finger electrodes 30b and the finger electrodes 40b. Further, the second electrode 30 on the second semiconductor layer 20 shades the light generated by the light-emitting diode 10 itself and affects the performance of the LED device.

SUMMARY OF THE INVENTION

It is one objective of the invention to provide an improved LED structure in order to solve the above-described prior art problems and shortcomings.

According to one embodiment of this invention, a light-emitting diode includes a substrate, a first semiconductor layer above the substrate, an active layer above the first semiconductor layer, a second semiconductor layer above the active layer, wherein the active layer is between the first semiconductor layer and the second semiconductor layer, a trench penetrating through the second semiconductor layer and the active layer to expose the first semiconductor layer, a first electrode disposed at a bottom of the trench, wherein the first electrode includes at least one first finger, an insulating layer covering the first electrode, and a second electrode including at least one second finger on the insulating layer, wherein the second finger overlaps with the first finger and the second finger has a width smaller than the trench.

According to another embodiment of this invention, a light-emitting diode includes a substrate, a first semiconductor layer above the substrate, an active layer above the first semiconductor layer, a second semiconductor layer above the active layer, a trench penetrating through the second semiconductor layer and the active layer and exposing a portion of the first semiconductor layer, a first electrode disposed at the bottom of the trench, an insulating layer covering the trench and the first electrode, and a second electrode disposed above the insulating layer. The first electrode and the second electrode are both situated in the trench.

According to another embodiment of this invention, a light-emitting diode includes a substrate, a first semiconductor layer above the substrate, an active layer above the first semiconductor layer, a second semiconductor layer above the active layer, a first transparent conductive layer above the second semiconductor layer, a trench penetrating through the first transparent conductive layer, the second semiconductor layer and the active layer and exposing a portion of the first semiconductor layer, a first electrode disposed at the bottom of the trench, an insulating layer covering the trench and the first electrode, and a second electrode disposed above the insulating layer. The first electrode comprises at least one first branch electrode. The second electrode comprises at least one second branch electrode. The second branch electrode overlaps and is parallel with the first branch electrode. The light-emitting diode further comprises a second transparent conductive layer disposed above the first transparent conductive layer and the insulating layer. The second branch electrode is disposed above the second transparent conductive layer.

These and other objectives of the present invention will no doubt become obvious to those of ordinary skill in the art after reading the following detailed description of the embodiment that is illustrated in the various figures and drawings.

DETAILED DESCRIPTION

Figure 1:
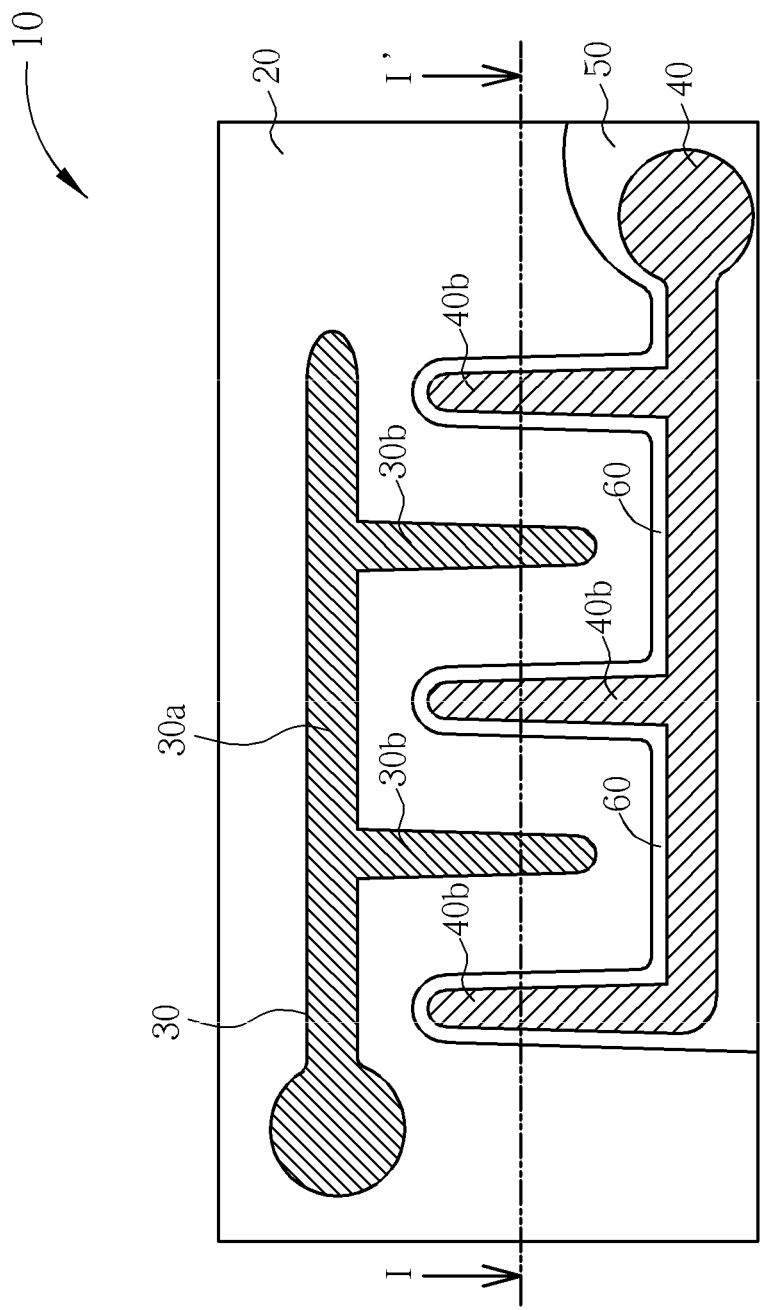
FIG. 1 is a plan view of a conventional light-emitting diode with comb-shaped electrodes.
Figure 2:
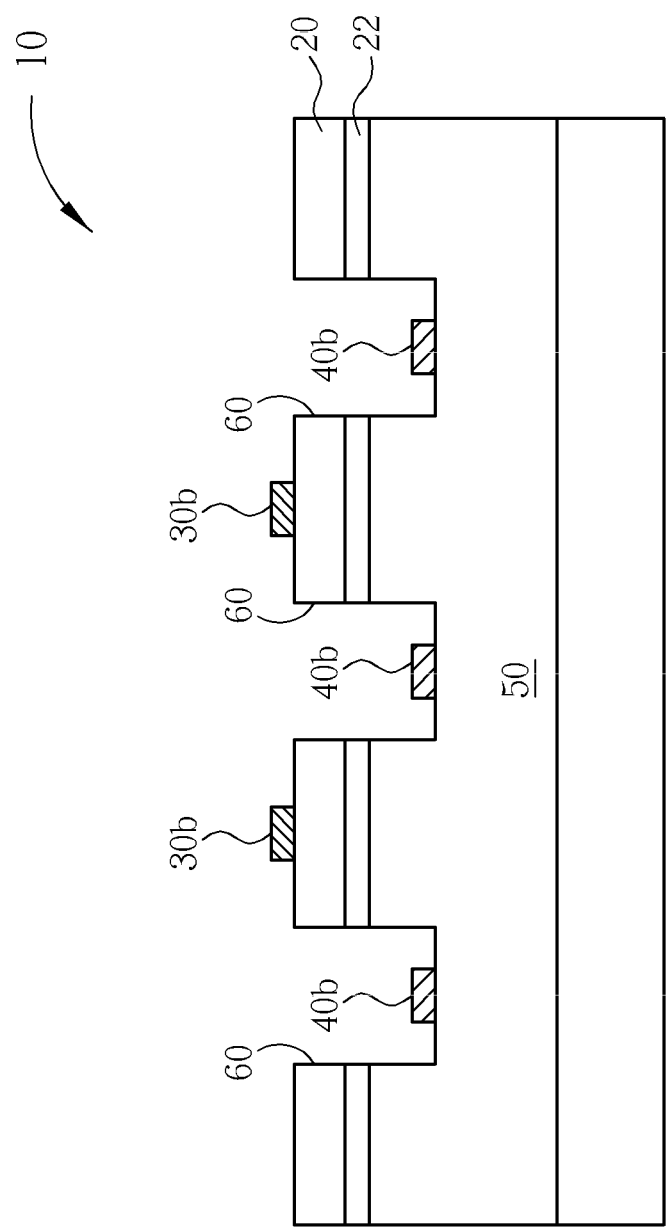
FIG. 2 is a cross-sectional view taken along line I-I' of FIG. 1.

In the following description, numerous specific details are given to provide a thorough understanding of the invention.

However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the FIGS. Also, where multiple embodiments are disclosed and described having some features in common, for clarity and ease of illustration and description thereof like or similar features one to another will ordinarily be described with like reference numerals.

Figure 3:
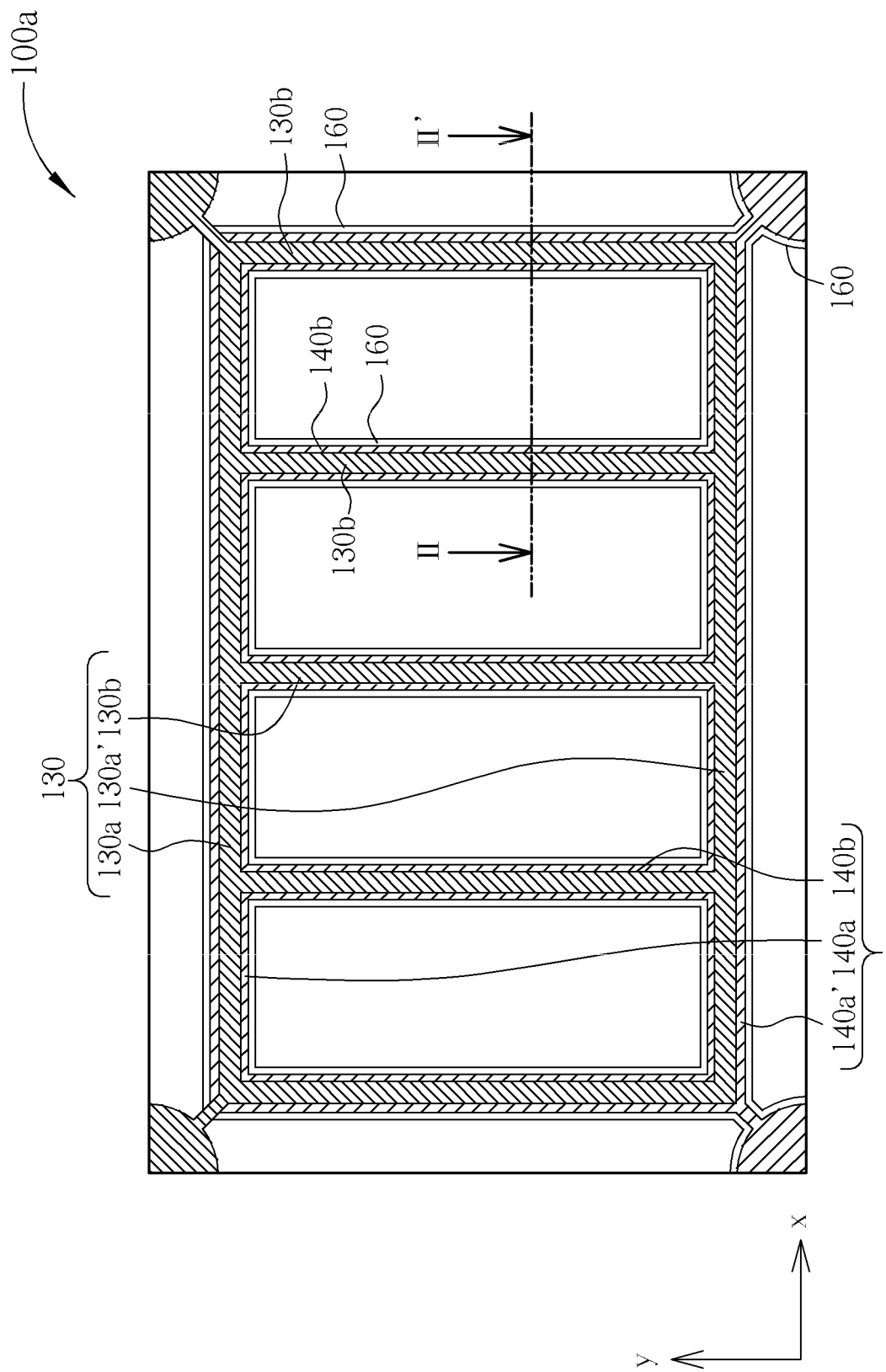
FIG. 3 is a schematic layout diagram showing the first electrode and the second electrode of the light-emitting diode according to the embodiment of this invention.
Figure 4:
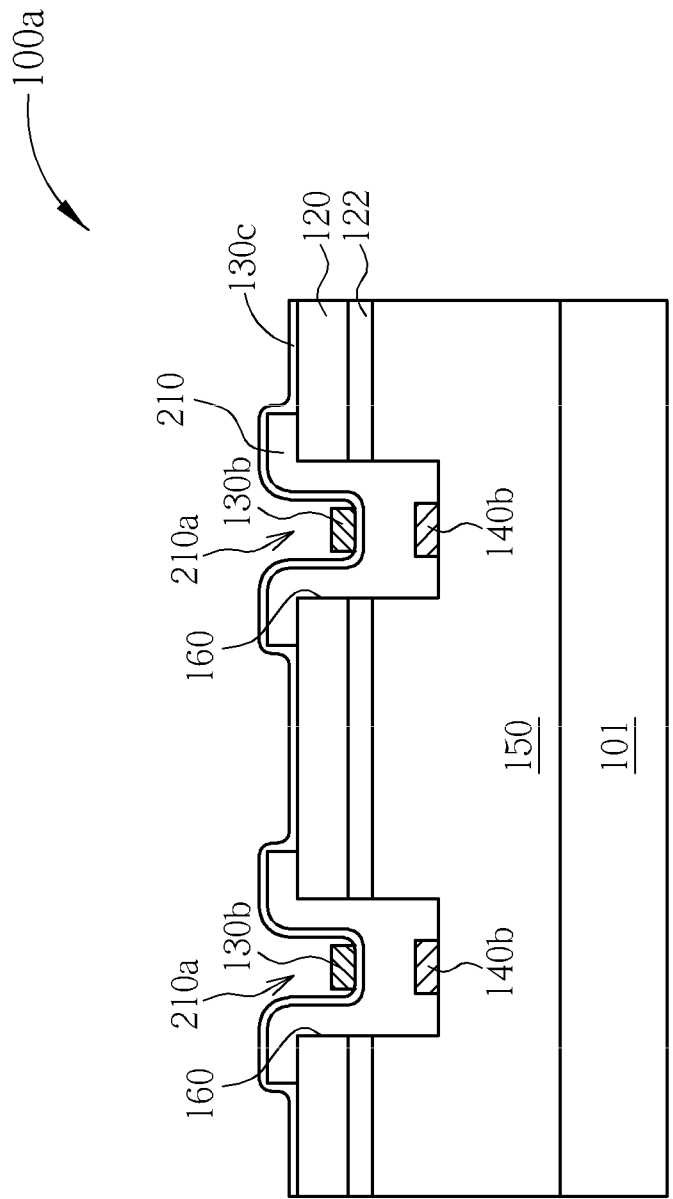
FIG. 4 is a schematic, cross-sectional diagram of the light-emitting diode taken along line II-II' of FIG. 3.

FIG. 3 is a schematic layout diagram showing the first electrode and the second electrode of the light-emitting diode 100a according to the embodiment of this invention. FIG. 4 is a schematic, cross-sectional diagram of the light-emitting diode 100a taken along line II-II' of FIG. 3. As shown in FIG. 3 and FIG. 4, the light-emitting diode 100a comprises a substrate 101. According to the embodiment of this invention, the substrate 101 is a non-conductive substrate such as sapphire. A first semiconductor layer 150, an active layer 122 and a second semiconductor layer 120 are disposed above the substrate 101. For example, the first semiconductor layer 150 is disposed on the substrate 101, the active layer 122 is disposed on the first semiconductor layer 150, and the second semiconductor layer 120 is disposed on the active layer 122. The first semiconductor layer 150, the active layer 122 and the second semiconductor layer 120 may be formed by epitaxial methods. According to the embodiment of this invention, the first semiconductor layer 150 and the second semiconductor layer 120 may include but not limited to GaN. It is understood that in another embodiment of this invention a buffer layer or other multi-quantum well (MQW) epitaxial structures may be incorporated into the above-described stack structure. According to the embodiment of this invention, the first semiconductor layer 150 may be N type semiconductor layer, and the second semiconductor layer 120 may be P type semiconductor layer. Alternatively, the first semiconductor layer 150 may be P type semiconductor layer, and the second semiconductor layer 120 may be N type semiconductor layer.

As best seen in FIG. 3, according to the embodiment of this invention, the light-emitting diode 100a comprises a first electrode 140 disposed within a trench 160 that is formed by etching through the second semiconductor layer 120 and the active layer 122. The trench 160 exposes a portion of the first semiconductor layer 150. According to the embodiment of this invention, the trench 160 may have a network pattern, annular shaped pattern or a closed-loop shaped pattern when viewed from above. The first electrode 140 is disposed at the bottom of the trench 160 and is in direct contact with the first semiconductor layer 150. The first electrode 140 may include a branch electrode 140a and a branch electrode 140a', both of which extend along the first direction or the reference x-axis. A plurality of branch electrodes or fingers 140b extend between the two parallel branch electrodes 140a and 140a' along the second direction or the reference y-axis. According to the embodiment of this invention, the first electrode 140 may include but not limited to Ti, Al, Au, Cr, Ti/Al, Ti/Au, Ti/Au/Al, Cr/Au, composites thereof or alloys thereof.

As shown in FIG. 4, the light-emitting diode 100a further comprises an insulating layer 210. According to the embodiment of this invention, the insulating layer 210 covers the bottom and sidewalls of the trench 160 and covers the first electrode 140. The insulating layer 210 may extend to a top surface of the second semiconductor layer 120. According to the embodiment of this invention, the insulating layer 210 does not fill up the trench 160 and defines a recess region 210a on the top surface of the insulating layer 210 within the trench 160. The recess-in-trench configuration is one critical feature of the embodiment. The recess region 210a has substantially identical layout with that of the trench 160.

According to the embodiment of this invention, the insulating layer 210 may be composed of transparent dielectric materials such as silicon oxide, silicon oxynitride, silicon nitride or the like. According to another embodiment of this invention, the insulating layer 210 may be composed of special dielectric structure with reflection effect, for example, distributed Bragg reflector (DBR) structure.

The light-emitting diode 100a further comprises a second electrode 130. The second electrode 130 is not disposed on the surface of the second semiconductor layer 120. Instead, the second electrode 130 is disposed in the recess region 210a within the trench 160. The first electrode 140 and the second electrode 130 are disposed on the same side of the substrate 101. Basically, the first electrode 140 and the second electrode 130 are both disposed within the trench 160 with an insulating layer 210 interposed therebetween. The second electrode 130 may comprise a branch electrode 130a and a branch electrode 130a', both of which extend along the first direction or the reference x-axis. A plurality of branch electrodes or fingers 130b extend along the second direction or the reference y-axis between the two parallel branch electrodes 130a and 130a'. As can be seen from FIG. 4, the first electrode 140 and the second electrode 130 are formed within the same trench 160. According to the embodiment of this invention, the second electrode 130 may include but not limited to Ti, Al, Au, Cr, Ti/Al, Ti/Au, Ti/Au/Al, Cr/Au, composites thereof or alloys thereof. According to the embodiment of this invention, the second electrode 130 is situated over the first electrode 140. The first electrode 140 overlaps with the second electrode 130 in a direction that is vertical to the main surface of the substrate 101.

According to the embodiment of this invention, the second electrode 130 may further comprise a transparent conductive layer (TCL) 130c. The transparent conductive layer 130c covers the exposed surface of the second semiconductor layer 120 and the surface of the insulating layer 210. According to the embodiment of this invention, the transparent conductive layer 130c may be composed of transparent conductive materials such as indium tin oxide (ITO) or very thin metal layers. Briefly referring to FIG. 4, the branch electrodes 130b is formed on the transparent conductive layer 130c and is in direct contact with the transparent conductive layer 130c.

One technical feature of the embodiment is that the first electrode 140 may be a closed-loop shaped or network shaped electrode pattern without protruding electrode end. Therefore, the current crowding due to incidental local fracture of the first electrode and point discharge are prevented. Another technical feature of the embodiment is that, except for wire bonding pad at the corners, the branch electrodes 130a, 130a' and 130b of the second electrode 130 substantially overlap with the branch electrodes 140a, 140a' and 140b of the first electrode 140 when viewed from above. For example, the ratio of overlap between the first electrode 140 and the second electrode 130 may be greater than 70%, even greater than 90%. Therefore, the light shading area is reduced and the current spreading characteristic is improved.

Summarily, the embodiment of the invention as set forth in FIG. 3 and FIG. 4 encompasses a light-emitting diode including a substrate 101; a first semiconductor layer 150 disposed above the substrate 101; an active layer 122 disposed above the first semiconductor layer 150; a second semiconductor layer 120 disposed above the active layer 122, wherein the active layer 122 is between the first semiconductor layer 150 and the second semiconductor layer 150; a trench 160 penetrating through the second semiconductor layer 120 and the active layer 122 to expose the first semiconductor layer 150; a first electrode 140 disposed at a bottom of the trench 160, wherein the first electrode 140 comprises at least one first branch electrode 140a or 140a'; an insulating layer 210 covering the first electrode 140; and a second electrode 130 comprising at least one second branch electrode 130a or 130a', wherein the second branch electrode 130a or 130a' is electrically isolated from the first branch electrode 140a or 140a', and wherein the second branch electrode 130a or 130a' overlaps with the first branch electrode 140a or 140a'.

Figure 5:
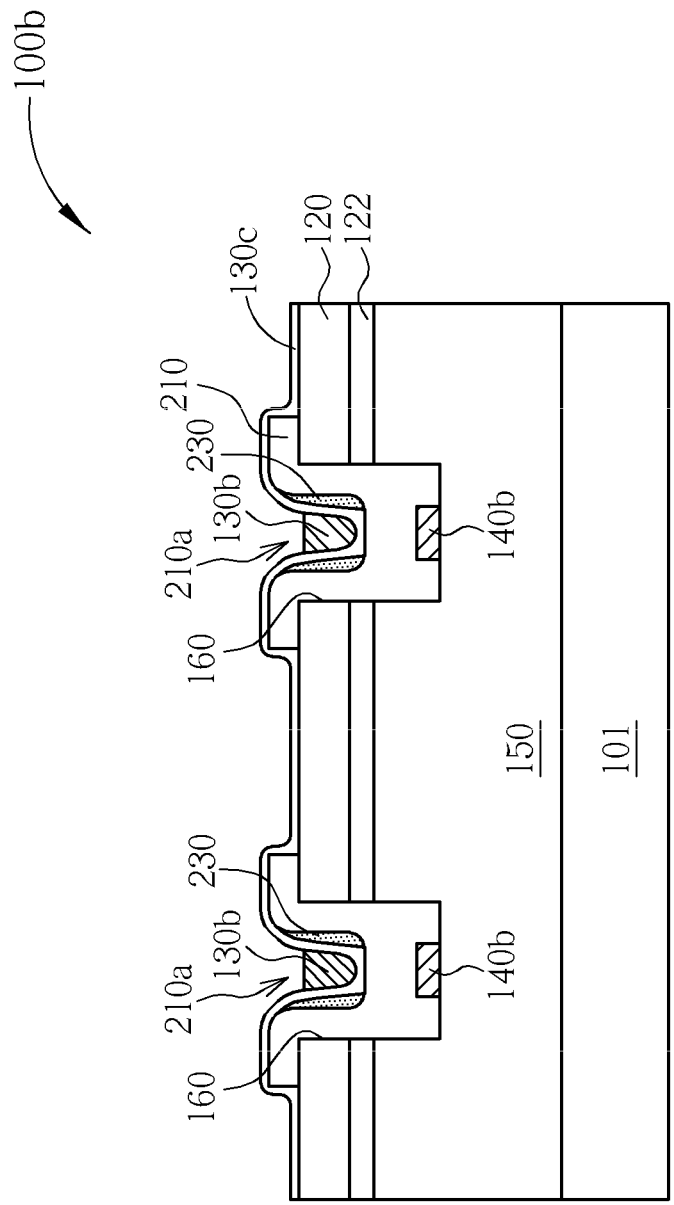
FIG. 5 is a schematic, cross-sectional diagram of the light-emitting diode according to another embodiment of this invention.

According to another embodiment of this invention, as shown in FIG. 5, a light-emitting diode 100b comprises a substrate 101, a first semiconductor layer 150, an active layer 122 and a second semiconductor layer 120. The light-emitting diode 100b further comprises a first electrode 140 disposed within a trench 160 that is formed by etching through the second semiconductor layer 120 and the active layer 122. The trench 160 exposes a portion of the first semiconductor layer 150. The first electrode 140 is disposed at the bottom of the trench 160 and is in direct contact with the first semiconductor layer 150. The first electrode 140 may include a branch electrode 140a and a branch electrode 140a', both of which extend along the first direction or the reference x-axis (FIG. 3). A plurality of branch electrodes or fingers 140b extend along the second direction or the reference y-axis (FIG. 3) between the two parallel branch electrodes 140a and 140a'. According to the embodiment of this invention, the first electrode 140 may include but not limited to Ti, Al, Au, Cr, Ti/Al, Ti/Au, Ti/Au/Al, Cr/Au, composites thereof or alloys thereof.

The light-emitting diode 100b further comprises an insulating layer 210. The insulating layer 210 covers the bottom and sidewalls of the trench 160 and covers the first electrode 140. The insulating layer 210 may extend to a top surface of the second semiconductor layer 120. The insulating layer 210 does not fill up the trench 160 and defines a recess region 210a on the top surface of the insulating layer 210 within the trench 160. A reflection layer 230 such as gold, silver, aluminum or the like may be disposed on the opposite sidewalls of the recess region 210a. The reflection layer 230 in the recess region 210a improves the light utility of the LED device. A transparent conductive layer 130c is provided to cover the exposed surface of the second semiconductor layer 120, the reflection layer 230 and the insulating layer 210. The branch electrode 130b of the second electrode 130 is formed on the transparent conductive layer 130c in the recess region 210a within the trench 160. The branch electrodes 130b is in direct contact with the transparent conductive layer 130c.

Figure 6:
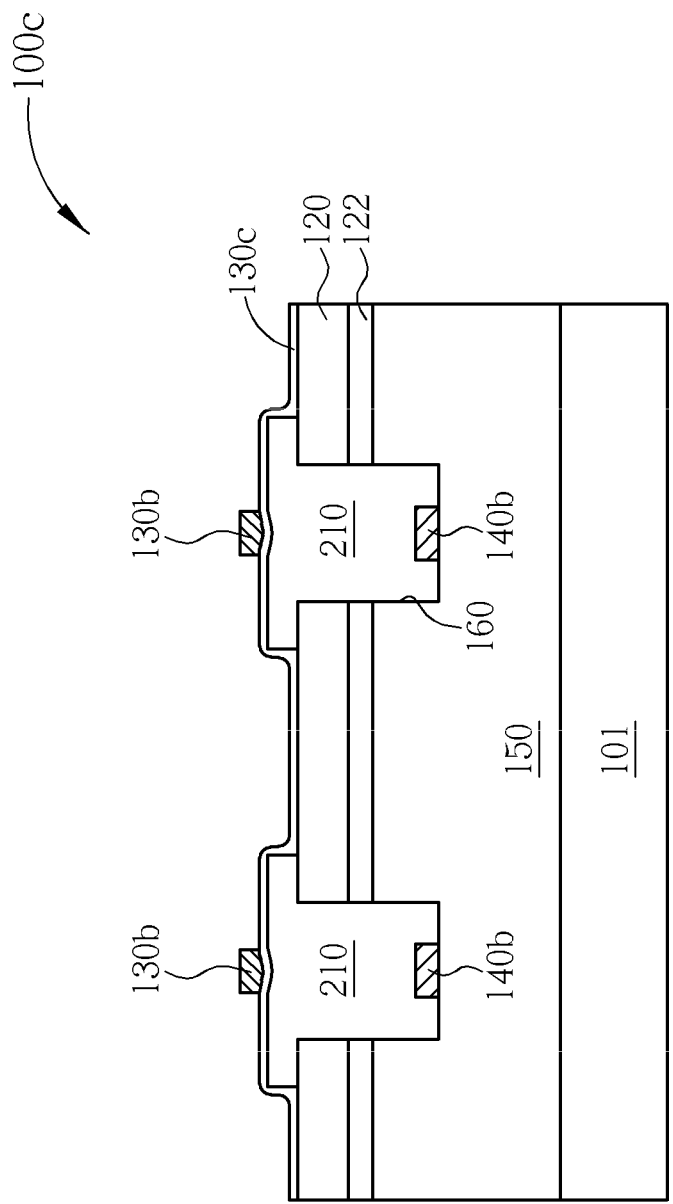
FIG. 6 is a schematic, cross-sectional diagram of the light-emitting diode according to another embodiment of this invention.

According to another embodiment of this invention, as shown in FIG. 6, a light-emitting diode 100c comprises a substrate 101, a first semiconductor layer 150, an active layer 122 and a second semiconductor layer 120. Likewise, the light-emitting diode 100c further comprises a first electrode 140 disposed within a trench 160 that is formed by etching through the second semiconductor layer 120 and the active layer 122. The trench 160 exposes a portion of the first semiconductor layer 150. The first electrode 140 is disposed at the bottom of the trench 160 and is in direct contact with the first semiconductor layer 150. The first electrode 140 may include a branch electrode 140a and a branch electrode 140a', both of which extend along the first direction or the reference x-axis (FIG. 3). A plurality of branch electrodes or fingers 140b extend along the second direction or the reference y-axis (FIG. 3) between the two parallel branch electrodes 140a and 140a'.

The light-emitting diode 100c further comprises an insulating layer 210. The insulating layer 210 fills up the trench 160 and covers the first electrode 140. The insulating layer 210 may extend to a top surface of the second semiconductor layer 120. A transparent conductive layer 130c is disposed on the exposed semiconductor layer 120 and on the surface of the insulating layer 210. The branch electrodes 130b of the second electrode 130 are disposed on the transparent conductive layer 130c. In this embodiment, the branch electrodes 130b of the second electrode 130 are not located within the trench 160 because the trench 160 is filled with the insulating layer 210. However, the branch electrodes 130b still overlap with the most part of the first electrode 140.

Figure 7:
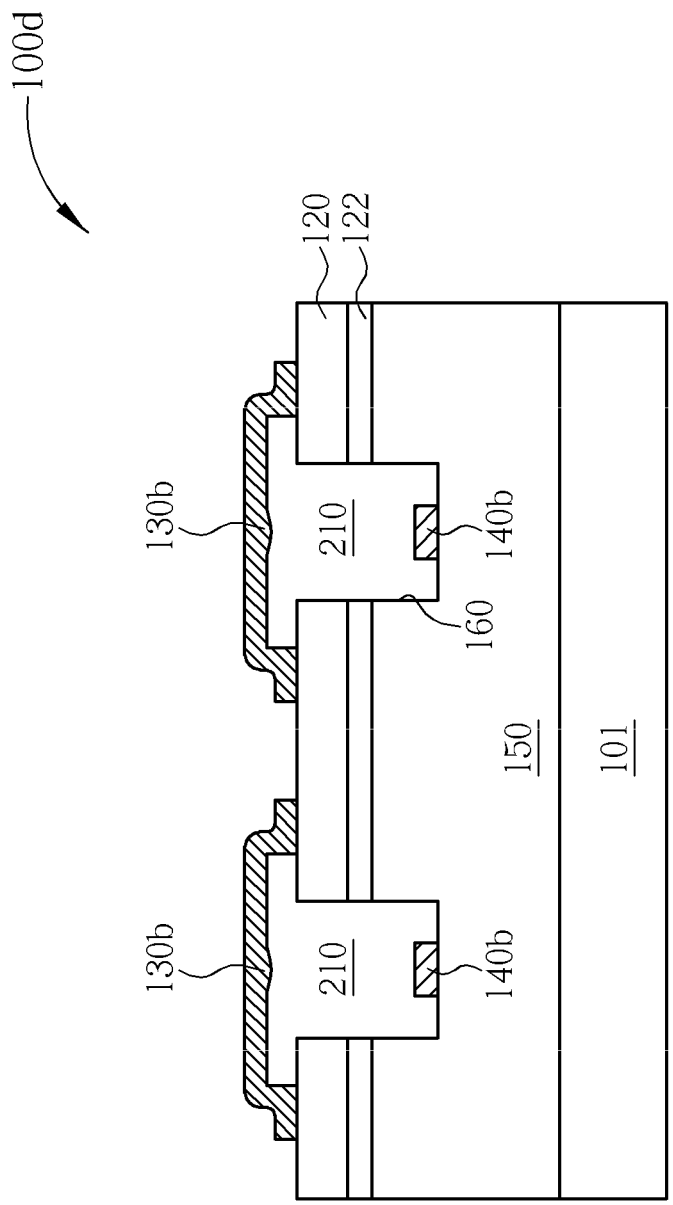
FIG. 7 is a schematic, cross-sectional diagram of the light-emitting diode according to another embodiment of this invention.

According to another embodiment of this invention, as shown in FIG. 7, a light-emitting diode 100d comprises a substrate 101, a first semiconductor layer 150, an active layer 122 and a second semiconductor layer 120. Likewise, the light-emitting diode 100d further comprises a first electrode 140 disposed within a trench 160 that is formed by etching through the second semiconductor layer 120 and the active layer 122. The trench 160 exposes a portion of the first semiconductor layer 150. The first electrode 140 is disposed at the bottom of the trench 160 and is in direct contact with the first semiconductor layer 150. The first electrode 140 may include a branch electrode 140a and a branch electrode 140a', both of which extend along the first direction or the reference x-axis (FIG. 3). A plurality of branch electrodes or fingers 140b extend along the second direction or the reference y-axis (FIG. 3) between the two parallel branch electrodes 140a and 140a'.

The light-emitting diode 100d further comprises an insulating layer 210. The insulating layer 210 fills up the trench 160 and covers the branch electrodes 140b of the first electrode 140. The insulating layer 210 may extend to a top surface of the second semiconductor layer 120. The difference between FIG. 6 and FIG. 7 is that the light-emitting diode 100d in FIG. 7 does not have a transparent conductive layer. The branch electrodes 130b of the second electrode 130 are disposed on the insulating layer 210 and overlap with the branch electrodes 140b of the first electrode 140 respectively. Further, each of the branch electrodes 130b laterally extends to the surface of the second semiconductor layer 120 whereby electrically connecting the second semiconductor layer 120 with the branch electrodes 130b.

Figure 8:
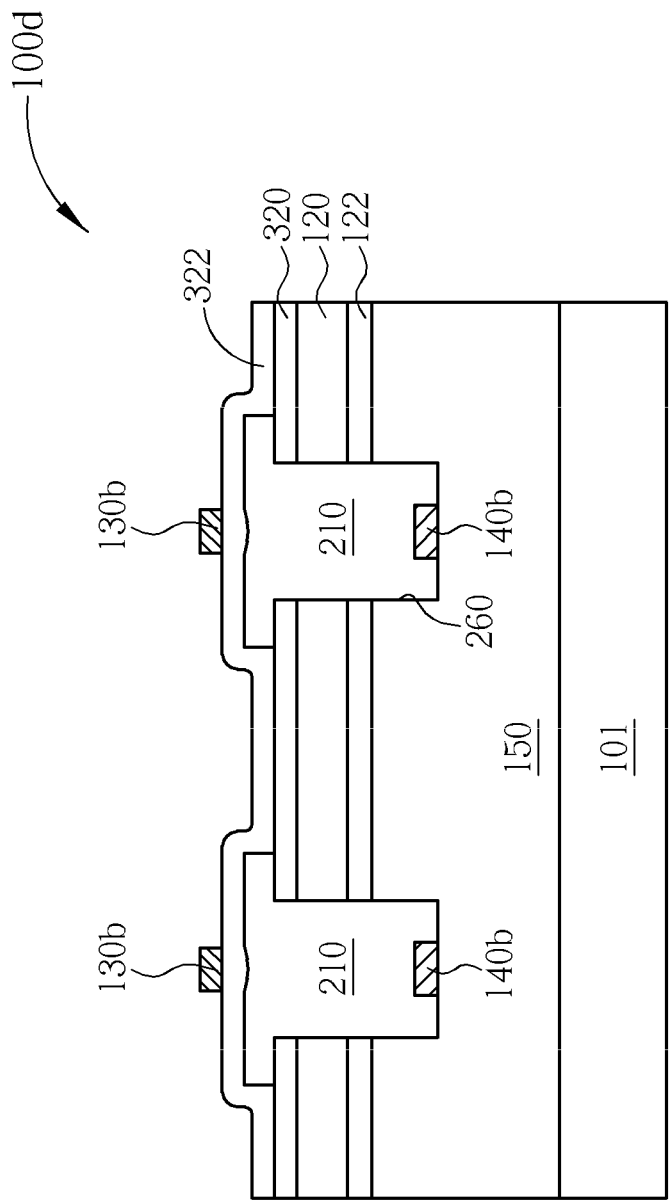
FIG. 8 is a schematic, cross-sectional diagram of the light-emitting diode according to another embodiment of this invention.

According to another embodiment of this invention, as shown in FIG. 8, a light-emitting diode 100e comprises a substrate 101, a first semiconductor layer 150, an active layer 122, a second semiconductor layer 120 and a first transparent conductive layer 320. Likewise, the light-emitting diode 100e further comprises a first electrode 140 disposed within a trench 260 that is formed by etching through the first transparent conductive layer 320, the second semiconductor layer 120 and the active layer 122. The trench 260 exposes a portion of the first semiconductor layer 150. The first electrode 140 is disposed at the bottom of the trench 260 and is in direct contact with the first semiconductor layer 150. The first electrode 140 may include a branch electrode 140a and a branch electrode 140a', both of which extend along the first direction or the reference x-axis (FIG. 3). A plurality of branch electrodes or fingers 140b extend along the second direction or the reference y-axis (FIG. 3) between the two parallel branch electrodes 140a and 140a'.

The light-emitting diode 100e further comprises an insulating layer 210. The insulating layer 210 fills up the trench 260 and covers the first electrode 140. The insulating layer 210 may extend to a top surface of the first transparent conductive layer 320. The light-emitting diode 100e further comprises a second transparent conductive layer 322 covers the first transparent conductive layer 320 and the insulating layer 210. The branch electrodes 130*b* are disposed on the second transparent conductive layer 322. In this embodiment, the branch electrodes 130*b* of the second electrode 130 are not located within the trench 260 because the trench 260 is filled with the insulating layer 210. However, the branch electrodes 130*b* still overlap with the most part of the first electrode 140.

Those skilled in the art will readily observe that numerous modifications and alterations of the device and method may be made while retaining the teachings of the invention.

What is claimed is:

1. A light-emitting diode, comprising:
    a substrate;
    a first semiconductor layer disposed above the substrate;
    an active layer disposed above the first semiconductor layer;
    a second semiconductor layer disposed above the active layer, wherein the active layer is between the first semiconductor layer and the second semiconductor layer;
    a trench penetrating through the second semiconductor layer and the active layer to expose the first semiconductor layer;
    a first electrode disposed at a bottom of the trench, wherein the first electrode comprises at least one first finger;
    an insulating layer covering the first electrode; and
    a second electrode comprising at least one second finger on the insulating layer, wherein the second finger overlaps with the first finger and the second finger has a width smaller than that of the trench.

2. The light-emitting diode according to claim 1, wherein the substrate is a non-conductive substrate.

3. The light-emitting diode according to claim 1, wherein the first electrode and the second electrode are disposed on the same side of the substrate.

4. The light-emitting diode according to claim 1, wherein the first electrode or the second electrode comprises a plurality of fingers.

5. The light-emitting diode according to claim 1, wherein the trench has a closed-loop shaped pattern.

6. The light-emitting diode according to claim 1, wherein the first finger is substantially parallel with the second finger.

7. The light-emitting diode according to claim 1, wherein a ratio of overlap between the first finger and the second finger is greater than 70%.

8. The light-emitting diode according to claim 1, wherein the insulating layer extends to a top surface of the second semiconductor layer.

9. The light-emitting diode according to claim 1, wherein the insulating layer covers a bottom and sidewalls of the trench, and defines a recess region within the trench.

10. The light-emitting diode according to claim 9, further comprising a metal reflection layer disposed within the recess region.

11. The light-emitting diode according to claim 9, wherein the second finger is disposed in the recess region.

12. The light-emitting diode according to claim 1 further comprising a transparent conductive layer disposed on the insulating layer and the second semiconductor layer.

13. The light-emitting diode according to claim 12, wherein the second finger is disposed on the transparent conductive layer.

14. The light-emitting diode according to claim 1, wherein the trench is filled with the insulating layer.

15. The light-emitting diode according to claim 1, wherein the second finger covers the insulating layer and is in direct contact with the second semiconductor layer.

16. The light-emitting diode according to claim 1, wherein the second electrode comprises a transparent conductive layer.

17. The light-emitting diode according to claim 16, wherein the second finger is disposed on the transparent conductive layer.

18. The light-emitting diode according to claim 1, wherein the second finger is disposed within the trench.

19. The light-emitting diode according to claim 1, wherein the second finger has a width smaller than the first finger.

* * * * *